US012207573B2

(12) United States Patent
Adusumilli et al.

(10) Patent No.: US 12,207,573 B2
(45) Date of Patent: Jan. 21, 2025

(54) PHASE CHANGE MEMORY CELL WITH SUPERLATTICE BASED THERMAL BARRIER

(71) Applicant: International Business Machines Corporation, Armonk, NY (US)

(72) Inventors: Praneet Adusumilli, Somerset, NJ (US); Kevin W. Brew, Niskayuna, NY (US); Takashi Ando, Eastchester, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 17/475,970

(22) Filed: Sep. 15, 2021

(65) Prior Publication Data

US 2023/0077912 A1    Mar. 16, 2023

(51) Int. Cl.
*H10N 70/00* (2023.01)
*H10B 63/10* (2023.01)
*H10N 70/20* (2023.01)

(52) U.S. Cl.
CPC ....... *H10N 70/8616* (2023.02); *H10N 70/231* (2023.02); *H10N 70/826* (2023.02); *H10N 70/8413* (2023.02)

(58) Field of Classification Search
CPC ............. H10N 70/8616; H10N 70/826; H10N 70/8828; H10N 70/8413; H10B 63/10
See application file for complete search history.

(56) References Cited

U.S. PATENT DOCUMENTS 7,247,876 B2 *  7/2007  Lowrey .................. H10B 63/20
                                                       257/18
7,453,081 B2    11/2008  Happ et al.
(Continued)

OTHER PUBLICATIONS

Shen et al., "Thermal Barrier Phase Change Memory," ACS Applied Materials and Interfaces, Jan. 9, 2019, 9 pages, https://www.researchgate.net/publication/330259575_Thermal_Barrier_Phase_Change_Memory.

(Continued)

*Primary Examiner* — Walter H Swanson
*Assistant Examiner* — Jacob T Nelson
(74) *Attorney, Agent, or Firm* — Jeffrey M. Ingalls

(57) ABSTRACT

A memory, system, and method to improve integration density while maintaining thermal efficiency through a phase change memory cell with a superlattice based thermal barrier. The phase change memory may include a bottom electrode. The phase change memory may also include an active phase change material. The phase change memory may also include a superlattice thermal barrier proximately connected to the active phase change material. The phase change memory may also include a top electrode proximately connected to the superlattice thermal barrier. The system may include the phase change memory cell. The method for forming a phase change memory may include depositing an active phase change material on a bottom electrode. The method may also include depositing a superlattice thermal barrier proximately connected to the active phase change material. The method may also include depositing a top electrode proximately connected to the superlattice thermal barrier.

20 Claims, 8 Drawing Sheets

(56) References Cited

U.S. PATENT DOCUMENTS

| | | | |
|---|---|---|---|
| 7,545,668 B2* | 6/2009 | Philipp | H10N 70/8828 365/163 |
| 7,663,840 B2* | 2/2010 | Mallary | G11B 5/656 428/829 |
| 7,679,074 B2* | 3/2010 | Philipp | H10N 70/841 257/4 |
| 9,024,284 B2 | 5/2015 | Oyanagi et al. | |
| 9,082,970 B2 | 7/2015 | Soeya et al. | |
| 9,177,640 B2 | 11/2015 | Shintani et al. | |
| 9,419,212 B2 | 8/2016 | Petz et al. | |
| 10,147,876 B1 | 12/2018 | Huang et al. | |
| 10,283,707 B2* | 5/2019 | Kamata | H10B 63/24 |
| 10,308,673 B2 | 6/2019 | Pore et al. | |
| 10,580,976 B2 | 3/2020 | Takahashi et al. | |
| 10,971,223 B2 | 4/2021 | Chen et al. | |
| 11,031,435 B2 | 6/2021 | Grobis et al. | |
| 2005/0118780 A1* | 6/2005 | Balakumar | H01L 28/56 257/E21.018 |
| 2008/0006811 A1* | 1/2008 | Philipp | H10N 70/8828 438/409 |
| 2019/0123103 A1* | 4/2019 | Wu | H10N 70/8413 |
| 2021/0091307 A1* | 3/2021 | BrightSky | H10N 70/826 |

OTHER PUBLICATIONS

Kwon et al., "Uncovering Thermal and Electrical Properties of Sb2Te3/GeTe Superlattice Films," Printed Sep. 13, 2021, 23 pages.

* cited by examiner

| GeTe 430a | Sb₂Te₃ 440a |
| GeTe 430b | Sb₂Te₃ 440b |
| GeTe 430c | Sb₂Te₃ 440c |
| GeTe 430d | Sb₂Te₃ 440d |
| GeTe 430e | Sb₂Te₃ 440e |
| GeTe 430f | Sb₂Te₃ 440f |

TiTe 530a | $Sb_2Te_3$ 540a
TiTe 530b | $Sb_2Te_3$ 540b
TiTe 530c | $Sb_2Te_3$ 540c
TiTe 530d | $Sb_2Te_3$ 540d
TiTe 530e | $Sb_2Te_3$ 540e
TiTe 530f | $Sb_2Te_3$ 540f

FIG. 5

PHASE CHANGE MEMORY CELL WITH SUPERLATTICE BASED THERMAL BARRIER

BACKGROUND

The present disclosure relates to phase change memory and, more specifically, to improving integration density while maintaining the thermal efficiency through a phase change memory cell with a superlattice based thermal barrier between the active phase change material and the top electrode.

Phase change memory (PCM) is a non-volatile random access memory (NVRAM). PCMs contain phase-change materials (such as alloys containing Tellurium) and may alter the states (e.g., crystalline and amorphous phases) of the PCM using heat. The phase-change materials may be placed between two electrodes, and when the phase-change materials are in a crystalline state the phase-change materials have a high conductivity and a low resistivity (which corresponds to a logical 1), allowing current to travel quickly thorough the phase-change materials and between electrodes. When the phase-change materials are in an amorphous state, the materials have a low conductivity and a high resistivity (which corresponds to a logical 0), preventing current from travelling quickly through the phase-change materials and between the electrodes. The portions of the phase-change material that are amorphous and crystalline may be controlled to achieve intermediate conductivity values, for use in analog computing. The data is stored using the contrast between resistances of the multiple states. The PCM is a non-volatile memory, as the states can remain if/when power is removed, allowing PCMs to retain data even when there is no power.

SUMMARY

The present invention provides a phase change memory, system, and method to improve integration density while maintaining the thermal efficiency through a phase change memory cell with a superlattice based thermal barrier between the active phase change material and the top electrode. The phase change memory may include a bottom electrode. The phase change memory may also include an active phase change material. The phase change memory may also include a superlattice thermal barrier proximately connected to the active phase change material. The phase change memory may also include a top electrode proximately connected to the superlattice thermal barrier.

The system may include a phase change memory cell. The phase change memory cell may include a bottom electrode. The phase change memory cell may also include an active phase change material. The phase change memory cell may also include a superlattice thermal barrier proximately connected to the active phase change material. The phase change memory cell may also include a top electrode proximately connected to the superlattice thermal barrier.

The method for forming a phase change memory may include depositing an active phase change material on a bottom electrode. The method may also include depositing a superlattice thermal barrier proximately connected to the active phase change material. The method may also include depositing a top electrode proximately connected to the superlattice thermal barrier.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 4 depicts a first exemplary superlattice thermal barrier layer, according to some embodiments.

FIG. 5 depicts a second exemplary superlattice thermal barrier layer, according to some embodiments.

Figure 1:
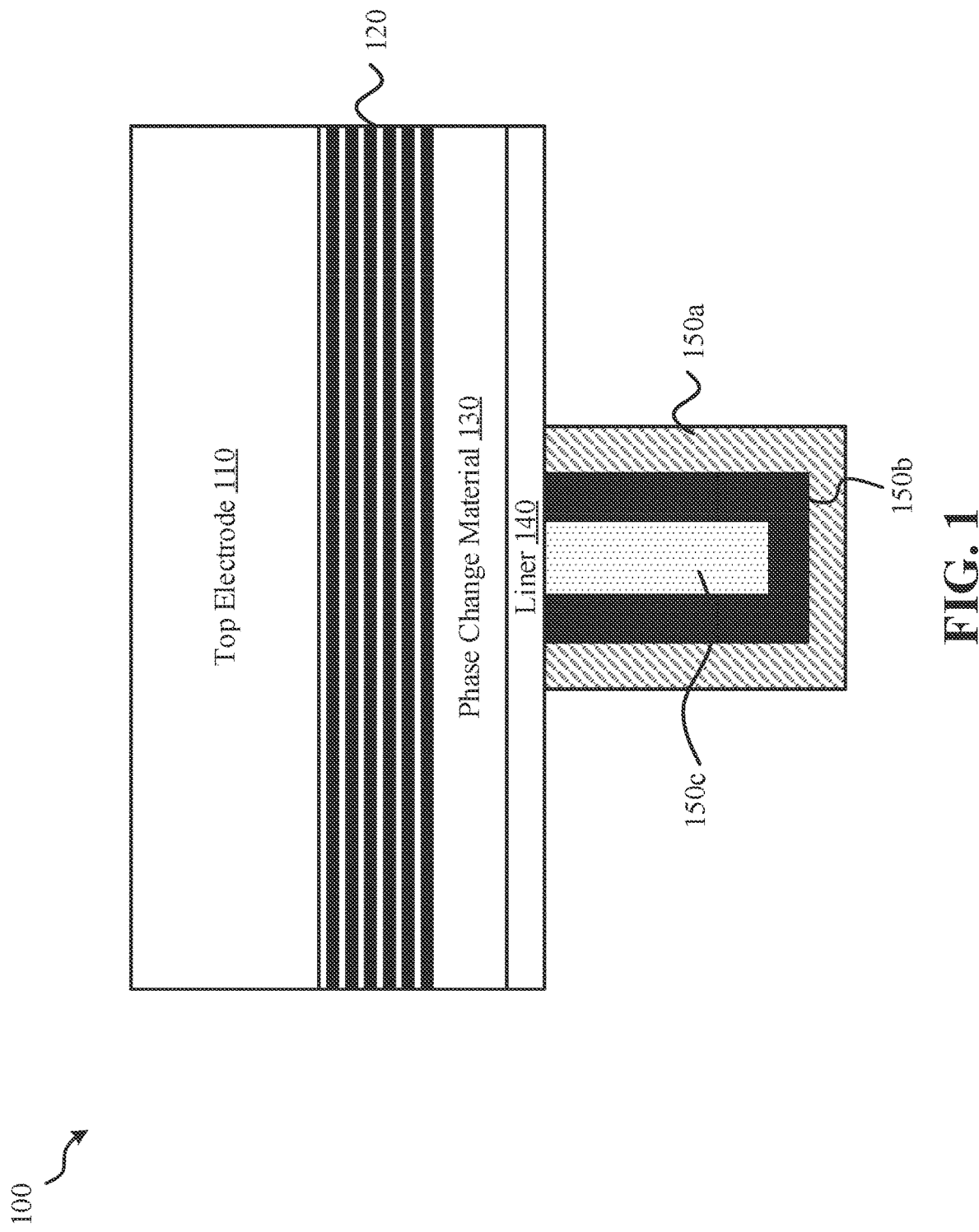
FIG. 1 depicts a phase change memory cell with a superlattice thermal barrier layer and a first exemplary bottom electrode, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to phase change memory and, more specifically, to improving integration density while maintaining the thermal efficiency through a phase change memory cell with a superlattice based thermal barrier layer between the active phase change material and the top electrode. While the present disclosure is not necessarily limited to such applications, various aspects of the disclosure may be appreciated through a discussion of various examples using this context.

A phase change memory (PCM) may include a bottom electrode and a top electrode with a phase change material between the two. As discussed above, conventional phase change memories (PCMs) and their corresponding phase change materials have two states—amorphous and crystalline. The amorphous state may be referred to as a RESET state and the crystalline state may be referred to as a SET state. To switch the phase change material between the two states, the PCM may also include a heater (sometimes called the bottom electrode and/or the bottom electrode contact) that sends current pulses from the heater into the phase change material. In some embodiments, the heater is the bottom electrode. In some embodiments, the heater is patterned on top of the bottom electrode. In these instances, the current pulses may originate in the bottom electrode, be transmitted through the heater, and then transmit into the phase change material.

When the phase change material is in a crystalline state, the heater may convert the material into an amorphous state by sending short high current pulses to rapidly heat the phase change material and then quenching or cooling it. When the phase change material is in an amorphous state, the heater may convert the material into a crystalline state by sending a longer, but lower current, pulse(s) to heat the phase change material to a crystallization temperature for a prolonged period of time (without cooling the material) to allow for the material to become crystalline.

When the phase change material (of the phase change memory) is in an amorphous state (or a RESET state, as it is sometimes referred to), the phase change material may have a high resistivity and a low conductivity (i.e., high electrical resistivity and low electrical conductivity), and current may not travel quickly through the phase change material. Alternatively, when the phase change material is in a crystalline state (or a SET state, as it is sometimes referred to), the phase change material may have a low resistivity and a high conductivity (i.e., low electrical resistivity and high electrical conductivity), and current may travel quickly through the phase change material. The data may be stored in the phase change memory (PCM) using the contrast between the resistances of the two states (or phases). Further, each state may correspond to a binary value, with an amorphous state corresponding to a 0 and a crystalline state corresponding to a 1. PCM has many benefits, such as increased speeds (compared to other types of memory), non-volatile capabilities, less power requirements, etc., however, conventional PCMs may have abrupt changes between the phases, particularly at the amorphous state (i.e., an abrupt change to the RESET state).

Resistance, as referred to herein, may be an electrical resistance, and may refer to the opposition of current flow through an object. Resistivity, as referred to herein, may be an electrical resistivity, and may refer to the resistance (i.e., electrical resistance) per unit area of an object and/or material. Resistivity may, for example, be calculated using the magnitude of the electric field and the magnitude of the current density (i.e., the magnitude of the electric field divided by the magnitude of the current density). Resistance may be calculated, for example, by multiplying the resistivity by the length of the object and/or material and dividing by the cross-sectional area of the object and/or material. When resistivity remains constant, the resistance of an object can be changed by changing the length, width, etc. of the object. For example, a titanium nitride (TiN) material may have different amounts of resistance depending on the length, width, etc. of the TiN object, however the resistivity of TiN does not change due to changes in the dimensions of the object formed by the TiN.

Similarly, conductance, as referred to herein, may be an electrical conductance, and may refer to the ease of current flow through an object (i.e., how easily current flows through an object). Conductivity, as referred to herein, may be an electrical conductivity, and may refer to the conductance (i.e., electrical conductance) per unit area of an object and/or material. When conductivity remains constant, the conductance of an object can be changed by changing the length, width, etc. of the object. Resistivity and conductivity are intrinsic properties, whereas resistance and conductance are extrinsic properties.

In PCMs, when current travels through the heater, heat is generated (for instance, through the Joule heating effect) and the heat can change the phase of the phase change material from a crystalline to an amorphous phase (or vice versa, depending on the amount of heat and whether there is a quench). Therefore, the greater the electrical conductance or the lesser the electrical resistance (referred to herein as conductance and resistance, respectively), the greater the flow of current (at a particular voltage) traveling through the heater and the greater the amount of heat generated from the flowing current.

In some instances, phase change memories are designed so that there is a switching zone, commonly referred to as a mushroom cell, where the phase change material first starts to change phase (e.g., from crystalline to amorphous, or vice versa). This zone may form as a dome shape similar to a top of a mushroom, in some instances.

In some instances, non-volatile memory devices (NVM devices) are used to accelerate artificial intelligence (AI) such as deep learning using neural networks. NVM devices may do different types of AI jobs such as inference and training. Inference may be the execution of various tasks (e.g., speech recognition, image recognition, etc.) once the neural network is fully trained. Training may be the process of training the neural network using training data sets. In conventional systems, graphics processing units (GPUs) may be used to perform these AI jobs. However, particularly for large networks, the AI jobs are extremely compute extensive (i.e., need a lot of computation). This causes a large amount of compute demand and may not have a high amount of compute efficiency. For example, (as an extreme) training a large AI language model (e.g., speech recognition model) may have a carbon footprint equivalent to lifetime emission from five cars. This example may be a somewhat extreme example, however even in less extreme examples there may be a large energy demand for the computing necessary for these large models in conventional systems. Therefore, there is a need for systems that are able to execute the same magnitude of computing while being much more energy efficient (for instance, many orders of magnitude more energy efficient) than conventional models.

The present disclosure provides a phase change memory, system, and method to improve integration density while maintaining the thermal efficiency through a phase change memory cell with a superlattice based thermal barrier layer between the active phase change material and the top electrode. The phase change memory (PCM) is a type of non-volatile memory (NVM) that is able to perform AI jobs through in-memory compute operations. By using the PCM and in-memory compute operations, the same magnitude of computing may be performed (by the PCM) while also making the computing much more energy efficient. In some instances, the system may include a plurality of PCMs in a cross-bar array configuration. Specifically, the synaptic weights of the neural network models can be mapped onto the PCM devices, and then the PCMs may perform the multiply and compute operations—which are the basic operations for ML and AI. When the PCMs are in an array, a lot of these ML operations may be executed in parallel (in the large array) in a single timestep. This may result in both a high energy efficiency and also a high speed in terms of how fast the computations are executed.

The energy efficiency of the computing on the PCM can be further improved by reducing the programming voltage and current of the PCM. If less voltage and/or current is needed to change the phase of the PCM (for example, from amorphous to crystalline or vice versa, from crystalline to partially amorphous by forming an amorphous mushroom cell, etc.), then less energy may be expended to generate the necessary voltage and/or current. One method of improving the programming voltage may be to use a thermal barrier in the PCM. The thermal barrier may help prevent heat from escaping the PCM (for instance, the heat generated through the transmitted current that is used to change the phase of the phase change material). If more heat is retained in the PCM and near the phase change material, then less current (and less programming voltage) may be needed to change the phase of the phase change material.

Some examples of thermal barriers in PCMs may include a thick carbon layer or a heavily doped phase change material (i.e., a phase change material with intentional impurities). However, both carbon and heavily doped phase change material may be challenging to work with. Carbon is a different material than the phase change material that is within the PCM, therefore the techniques used to deposit the carbon, and etch the carbon film, etc. may be different than the techniques used to deposit and etch the phase change material. Put more simply, because the carbon and the phase change materials have quite different properties, the different materials may require different techniques & chemistry to work with them—thus increasing the number of processing steps and integration complexity during fabrication of these devices. For example, different processing techniques and/or additional processing steps may be necessary when depositing the phase change material than when depositing the thick carbon layer due to the different properties of the material. Having to utilize different processing techniques and/or additional steps when working with the carbon versus the phase change materials may result in a significant amount of stopping and starting when forming the thermal barrier and the phase change material. Further, the heavily doped phase change material may have challenges such as resistance drift.

Therefore, instead of using thick carbon or heavily doped phase change material as a thermal barrier, the present disclosure proposes a thermal barrier that is a superlattice of phase change material layers. A superlattice, as referred to herein, is a structure with a plurality of layers. In some instances, the superlattice may include a plurality of materials. Further, in some instances, a superlattice may include alternating layers/materials. Because of the multiple layers in a superlattice stack, multiple different materials with high interfacial thermal resistance may be incorporated into the superlattice thermal barrier, which may improve the thermal efficiency of the PCM (therefore improving the energy efficiency of the PCM) as the heat may be contained near the phase change material and less current may be needed to generate the necessary heat. The multiple thin layers with a high interfacial thermal resistance may contain more heat (i.e., be more effective as a thermal barrier) than a single thick layer, as each of the multiple interfaces add to the total thermal resistance of the barrier film stack. A single deposition of a thick layer can result in a large grain structure (i.e., large sized grains) for the layer. Alternatively, when the layers are thinner (as in the thin multi-layer stack), the grain size of each layer is much smaller. The grain boundaries (i.e., interfaces between grains) can act as additional interfaces that add to the thermal resistance of the whole (i.e., the single thick layer or the multi-layer stack). The single thick layer with large sized grains has much less grain boundaries—as there are less grains—than the multi-layer stack, therefore the multi-layer stack has a higher thermal resistance than the single thick layer. This may result in less heat escaping through all the thin layers compared to the amount of heat that escaped through a single thicker layer.

Further, the superlattice thermal barrier may be made up of various phase change materials, therefore different techniques may not be needed when working with the thermal barrier and the phase change materials, as the materials may be similar. Put differently, when the thermal barrier is a material like carbon, which is a significantly different material with different properties than phase change materials, different techniques may be required when working with the carbon thermal barrier compared to when working with the phase change material (discussed above). However, when the thermal barrier is made of a phase change material (even if the actual phase change material used in the thermal barrier is different than the phase change material used as a phase change material), the thermal barrier is made of a same and/or similar material with similar properties to the actual phase change material and the same techniques may be used when working with the thermal barrier and the phase change material. In addition, the phase change materials used in the superlattice thermal barrier may be undoped, which may have a very low resistance drift compared to fully doped phase change materials.

Increasing the thermal efficiency of the phase change memory (PCM) may reduce the total thermal loss of the PCM, which may then increase the power efficiency, etc. of the PCM. This may result in a PCM with a high energy efficiency (for instance, when executing compute operations) without sacrificing computing speed/magnitude.

Referring now to FIG. 1, a phase change memory cell 100 with a superlattice thermal barrier 120 and a first exemplary bottom electrode 150 is depicted, according to some embodiments. Phase change memory cell 100 includes a bottom electrode 150 (including 150a, 150b, and 150c), liner 140, phase change material 130, superlattice thermal barrier 120, and top electrode 110. Current may be exchanged between the bottom electrode 150 and the top electrode 110. This current may generate heat, which may help change the phase of the phase change material 130 from crystalline to amorphous, or vice versa. Example phase change materials 130 include germanium-antimony-tellurium (or $Ge_2Sb_2Te_5$, referred to herein as GST), GeTe, $Sb_2Te_3$, TiTe, any other elemental, binary, or ternary alloys of antimony, tellurium, and germanium, or any other alternative materials. In some instances, as depicted in FIG. 1, a liner 140 may be used between the bottom electrode 150 and the phase change material 130. The liner 140 may help stabilize resistance and reduce resistance drift (particularly in RESET states (i.e., amorphous phases). The liner 140 (for example, a projection liner) may be made up of carbon, titanium nitride (TiN), titanium carbide (TiC), tantalum nitride (TaN), tantalum carbide (TaC), tungsten nitride (WN), tungsten carbide (WC), titanium silicon nitride (TiSiN), tantalum silicon nitride (TaSiN), etc. The liner 140 may be directly in contact with and/or proximately connected to the phase change material. Further, bottom electrode 150 may be described as proximately connected to liner 140, phase change material 130 may be described as proximately connected to superlattice thermal barrier 120, and superlattice thermal barrier 120 may be described as proximately connected to top electrode 110.

Although phase change memory (PCM) cell 100 is depicted as having liner 140, this is just an exemplary embodiment. Other phase change memory cells may not include a liner 140. In these instances (not depicted), bottom electrode 150 may be described as proximately connected to phase change material 130.

As depicted in FIG. 1, heater 150 includes a plurality of layers 150a, 150b, and 150c within the bottom electrode. In some instances, layer 150b may be a heater, layer 150c may be a dielectric, and layer 150a may be either another layer to the heater, a conductive layer outside of the heater, or another dielectric layer. In some embodiments, layer 150a is TaN, layer 150b is TiN, and layer 150c is silicon nitride (SiN). In some embodiments, layer 150a is TaN, layer 150b is TiN, and layer 150c is another layer of TaN. In some instances, although bottom electrode 150 is depicted as having separate layers 150a, 150b, and 150c, heater 150 may have only one or two layers. For instance, bottom electrode 150 may be made up of solid TaN or TiN only (i.e., having a single layer of TaN or TiN). In other instances, layer 150c may be SiN, and layers 150a and 150b may be a combined layer of TaN or TiN (i.e., having two layers—one of SiN and one of TaN or TiN). Bottom electrode 150 may be described/referred to herein as a U-shaped bottom electrode, as the cross-section of the layers of the electrode are in a U-like shape. This may be referred to as a U-shaped cross-section. When looking from the top down, layer 150c may be the inside/core layer, layer 150b may surround layer 150c, and layer 150a may be the outside layer surrounding layer 150b. Bottom electrode 150 is further discussed herein and depicted in FIG. 3A.

As discussed herein, phase change memory cell 100 includes a superlattice thermal barrier 120 to help keep heat (for instance, generated from current exchanged between bottom electrode 150 and top electrode 110) near phase change material 130. This may reduce the amount of current and/or voltage transmitted between bottom electrode 150 and top electrode 110, which may increase the energy efficiency of the phase change memory cell 100. The superlattice thermal barrier is further discussed herein and depicted in FIGS. 4-7.

Figure 2:
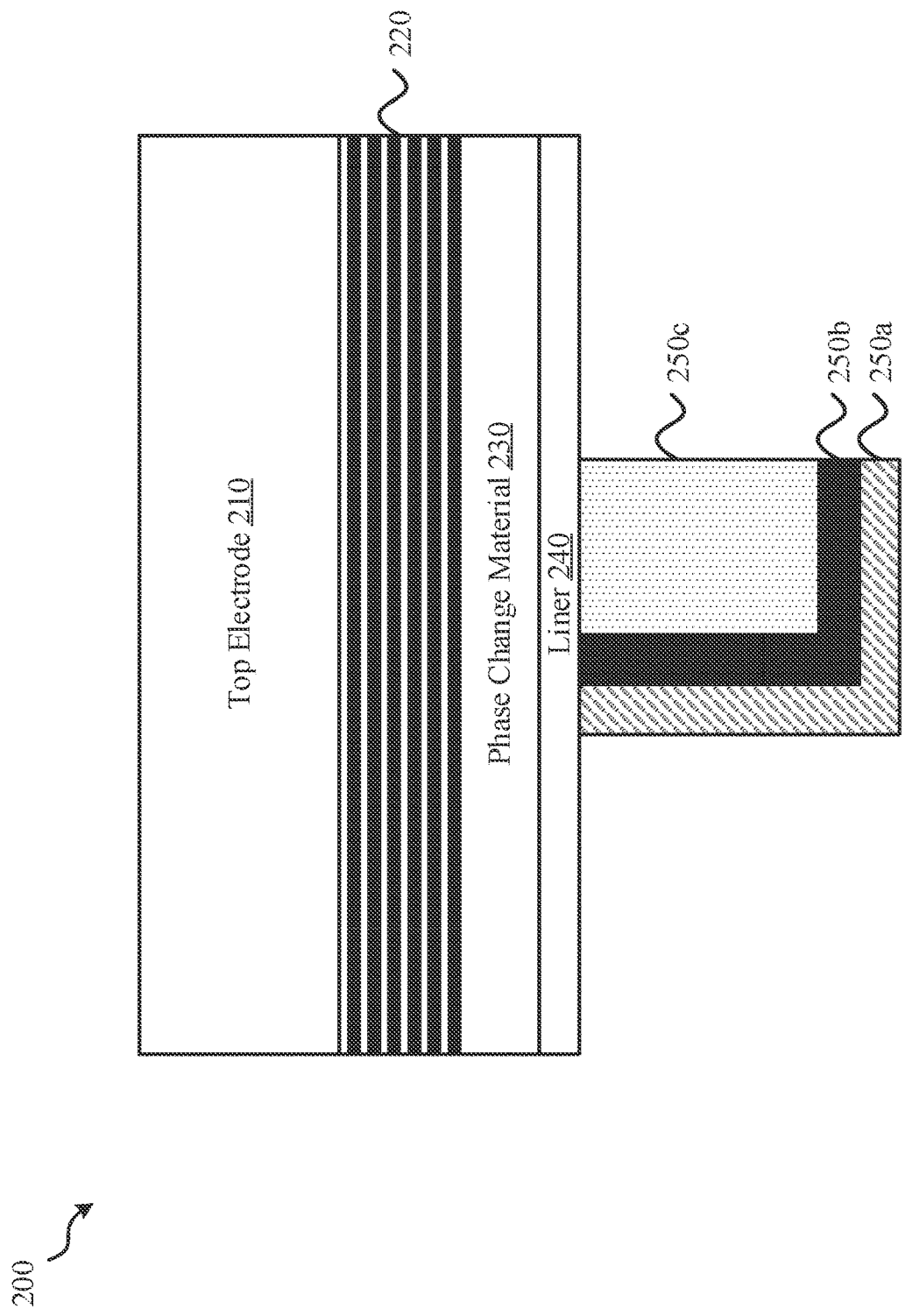
FIG. 2 depicts a phase change memory cell with a superlattice thermal barrier layer and a second exemplary bottom electrode, according to some embodiments.

Referring to FIG. 2, a phase change memory cell 200 with a superlattice thermal barrier and a second exemplary bottom electrode is depicted, according to some embodiments. Liner 240 may correspond to liner 140 (FIG. 1), phase change material 230 may correspond to phase change material 130 (FIG. 1), superlattice thermal barrier 220 may correspond to superlattice thermal barrier 120 (FIG. 1), and top electrode 210 may correspond to top electrode 110 (FIG. 1). Bottom electrode 250 may serve a same/similar purpose and functionality to bottom electrode 150 (FIG. 1), however bottom electrode 250 is, as illustrated, structured differently.

Similar to bottom electrode 150 (FIG. 1), bottom electrode 250 may include layers 250a, 250b, and 250c, however the cross-section of these layers (250a, 250b, and 250c) are in an L-shape. This may be referred to as an L-shaped cross-section. In some instances, layer 250c may be a dielectric, layer 250b may be a heater, and layer 250a may be another layer of the heater, another layer of dielectric, or a separate layer of conductive material. In some embodiments, layer 250a is TaN, layer 250b is TiN, and layer 250c is SiN. In some embodiments, layer 250a is TaN, layer 250b is TiN, and layer 250c is another layer of TaN. In some instances, although bottom electrode 250 is depicted as having separate layers 250a, 250b, and 250c, heater 250 may have only one or two layers. For instance, bottom electrode 250 may be made up of solid TaN or TiN only (i.e., having a single layer of TaN or TiN). In other instances, layer 250c may be SiN, and layers 250a and 250b may be a combined layer of TaN or TiN (i.e., having two layers—one of SiN and one of TaN or TiN). A preferred embodiment of bottom electrode 250 may be to have layer 250c as a dielectric such as SiN.

Bottom electrode 250 may be described herein as an L-shaped bottom electrode, due to the L-shape of the layers 250a-c. Because the layers of bottom electrode 250 are in an L-shape, only the current transferred and heat generated from one side of the layers 250a-c may transmit to the phase change material 230 (i.e., through liner 240 to the phase change material 230). This may control/limit the active area of the phase change material 230. This is discussed further herein and depicted in FIG. 3B.

In some instances, a system may include an array of multiple phase change memory cells 100 (FIG. 1) and/or phase change memory cells 200. This may allow the various phase change memory cells to execute memory compute operations in parallel in a single timestep. This may result in both a high energy efficiency and also a high speed in terms of how fast the computations are executed.

Figure 3B:
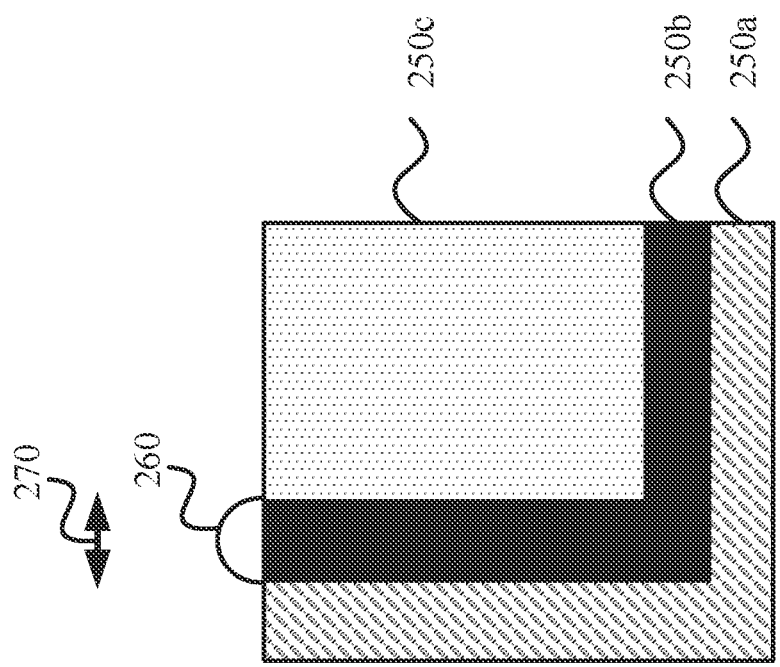
FIG. 3B depicts a mushroom cell forming on the second exemplary bottom electrode, according to some embodiments.
Figure 3A:
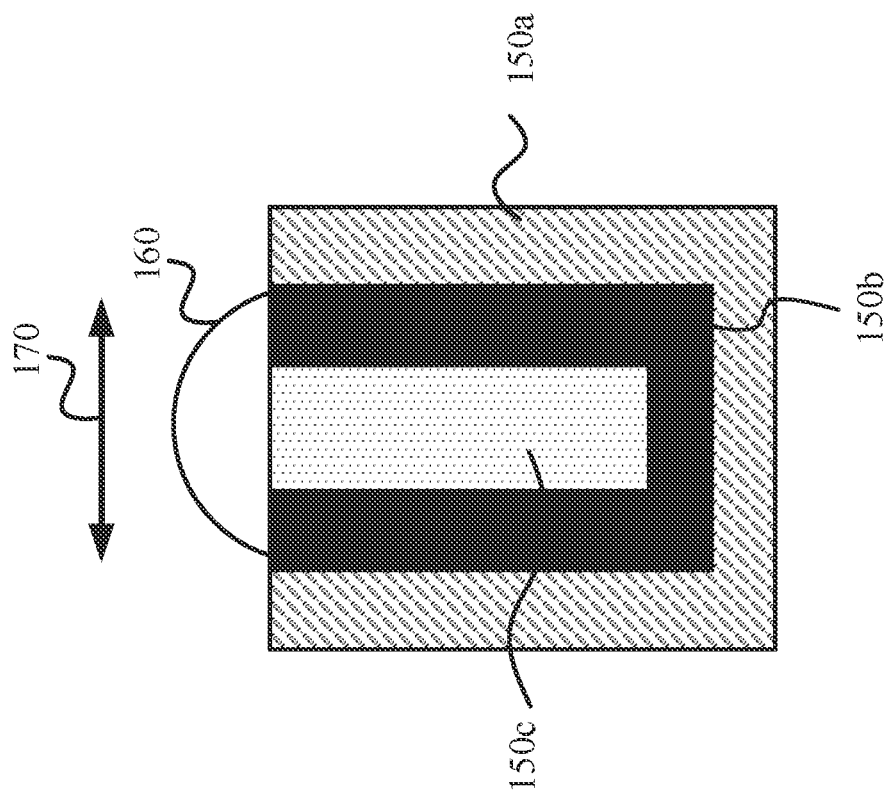
FIG. 3A depicts a mushroom cell forming on the first exemplary bottom electrode, according to some embodiments.

Referring now to FIG. 3A, a mushroom cell 160 forming on the first exemplary bottom electrode 150 is depicted, according to some embodiments. Bottom electrode 150 may be the same bottom electrode 150 depicted in FIG. 1 and has a U-shaped cross-section. As depicted in FIG. 1, bottom electrode 150 has two portions of the heater layer 150b that are in contact with the liner 140 and/or the phase change material 130 (for instance, when the phase change memory cell does not include a liner 140). This may result in the bottom electrode 150 having an effective electrode width 170 spanning both sides of heater layer 150b, as any current transmitted and heat generated from the heater layer 150b may (eventually) cover the whole width 170. The effective electrode width 170 may be the width of the bottom electrode 150 that is effective at transmitting current/heat. This means that the phase change material 130 has an active area (i.e., an area where the phase change material 130 is changing phase) spanning the entire effective electrode width 170. This is shown, in FIG. 3A by the crystalline phase change material 130 (not depicted in FIG. 3A), changing phase to an amorphous mushroom cell 160 in the effective electrode width 170 area.

Referring to FIG. 3B, a mushroom cell 260 forming on the second exemplary bottom electrode 250 is depicted, according to some embodiments. Bottom electrode 250 may be the same bottom electrode 250 depicted in FIG. 2 and has an L-shaped cross-section. As discussed herein, bottom electrode 250 includes layers 250a-250c that are only in contact with the liner 240 and/or phase change material 230 (for instance, when the phase change memory cell does not include a liner 240) on one portion of the bottom electrode layers 250a-250c (as opposed to the two portions of contact from the U-shaped bottom electrode 150). This may reduce the effective electrode width 270 to the width of the heater layer 250b that is in contact with the phase change material 230 and/or layer 240. This may constrain the amount of active area in the phase change material 230 (compared to the active area in phase change material 130) as the effective electrode width 270 is much smaller.

As mentioned above, the effective electrode width 270 may be the portion of the bottom electrode 250 that is effective at transferring current/heat to the phase change material 230. With a smaller effective electrode width 270, the amount of current transferred and heat generated from the bottom electrode 250 (specifically from layer 250b) may be smaller, which may result in a smaller amorphous mushroom cell 260 being formed in the phase change material 230 (not depicted in FIG. 3B). The smaller effective electrode width 270 may further increase the energy/power efficiency of the PCM as the active area and the area of the phase change material 230 where the mushroom cell 260 is formed is constrained and less current may be needed.

Referring to FIG. 4, a first exemplary superlattice thermal barrier 420 is depicted, according to some embodiments. Superlattice thermal barrier 420 may correspond to superlattice thermal barrier 120 (FIG. 1) or superlattice thermal barrier 220 (FIG. 2). Put differently, superlattice thermal barrier 420 may be a part of a phase change material cell with a U-shaped bottom electrode (such as bottom electrode 150) or a phase change material cell with an L-shaped bottom electrode (such as bottom electrode 250), in some instances.

As depicted in FIG. 4, superlattice thermal barrier 420 includes a plurality of layers, some with a germanium telluride (GeTe) material and some with an antimony telluride ($Sb_2Te_3$) material. Superlattice thermal barrier layers 430a-f are made of GeTe and superlattice thermal barrier layers 440a-f are made of $Sb_2Te_3$. In some instances, as depicted in FIG. 4, the superlattice thermal barrier layers of germanium telluride (GeTe) and the superlattice thermal barrier layers of antimony telluride ($Sb_2Te_3$) may be alternating layers. As mentioned herein, both GeTe and $Sb_2Te_3$ may be possible phase change materials (which may make them similar to the phase change material (such as phase change material 130 and/or 230)). To help avoid confusion, the phase change material (such as 130 and/or 230) that is being used as the phase change material (i.e., is meant to change phases from amorphous to crystalline, and vice versa) may be referred to herein as an active phase change material. The layers of phase change material used in the superlattice thermal barrier may be referred to herein as thermal barrier materials.

The thermal barrier materials of germanium telluride (GeTe) and antimony telluride ($Sb_2Te_3$) may have a higher resistance than typical active phase change materials such as GST. This may allow for the thermal barrier materials to act as a thermal barrier (as opposed to an active phase change material), while also remaining similar enough to the active phase change material that similar integration methods (for example, formation methods, etching methods, etc.) may be used on both the active phase change material and the superlattice thermal barrier. This may prevent constant starting and stopping to switch techniques during the formation of the phase change material cell.

In some instances, each layer 430a-f (referred to collectively as layers 430) and 440a-f (referred to collectively as layers 440) may have a thickness of between 1 and 5 nanometers (nm). The thermal conductivities of GeTe and $Sb_2Te_3$ may be lower within this range, compared to thicker layers of thermal barrier material. In some instances, each layer 430 of GeTe may be 1 nm thick and each layer 440 of $Sb_2Te_3$ may be 4 nm thick. This may result in a minimum amount of thermal conductivity for each layer 430 and 440. In some instances, although twelve layers 430 and 440 are depicted, superlattice thermal barrier 420 may have anywhere up to 50 layers. In some instances, superlattice thermal barrier 420 may have between 10 and 30 layers of thermal barrier material. In some instances, superlattice thermal barrier 420 may have between 10 and 50 layers. Superlattice thermal barrier 420 may be 2.5 times (or more) more thermally resistant that a thermal barrier made of a single layer of phase change material (such as GST). This may reduce the thermal loss and increase the energy efficiency of the PCM cell, as discussed herein. Further, both GeTe and $Sb_2Te_3$ may have a low resistance drift in the crystalline phase (and superlattice thermal barrier 420 may remain in a crystalline phase), which may help prevent resistance drift in the PCM cell.

Referring to FIG. 5, a second exemplary superlattice thermal barrier 520 is depicted, according to some embodiments. Superlattice thermal barrier 520 may correspond to superlattice thermal barrier 120 (FIG. 1) or superlattice thermal barrier 220 (FIG. 2). Thermal barrier 520 includes a plurality of layers (530 a-f) of titanium telluride (TiTe) and a plurality of layers (540a-f) of $Sb_2Te_3$. The layers 540 of $Sb_2Te_3$ may correspond to the layers 440 of $Sb_2Te_3$ depicted in FIG. 4. In some instances, titanium telluride may be $TiTe_2$. Titanium telluride may be a phase change material/thermal barrier material similar to germanium telluride and, like GeTe, may have a higher resistance than typical active phase change materials such as GST. In some embodiments, as depicted in FIG. 5, the superlattice thermal barrier 520 may include alternating layers of TiTe (530) and $Sb_2Te_3$ (540). In some instances, each layer may be between 1 and 5 nanometers thick. In some instances, the layers 530 of TiTe may be 1 nm thick and the layers 540 of $Sb_2Te_3$ may be 4 nm thick.

Figure 6:
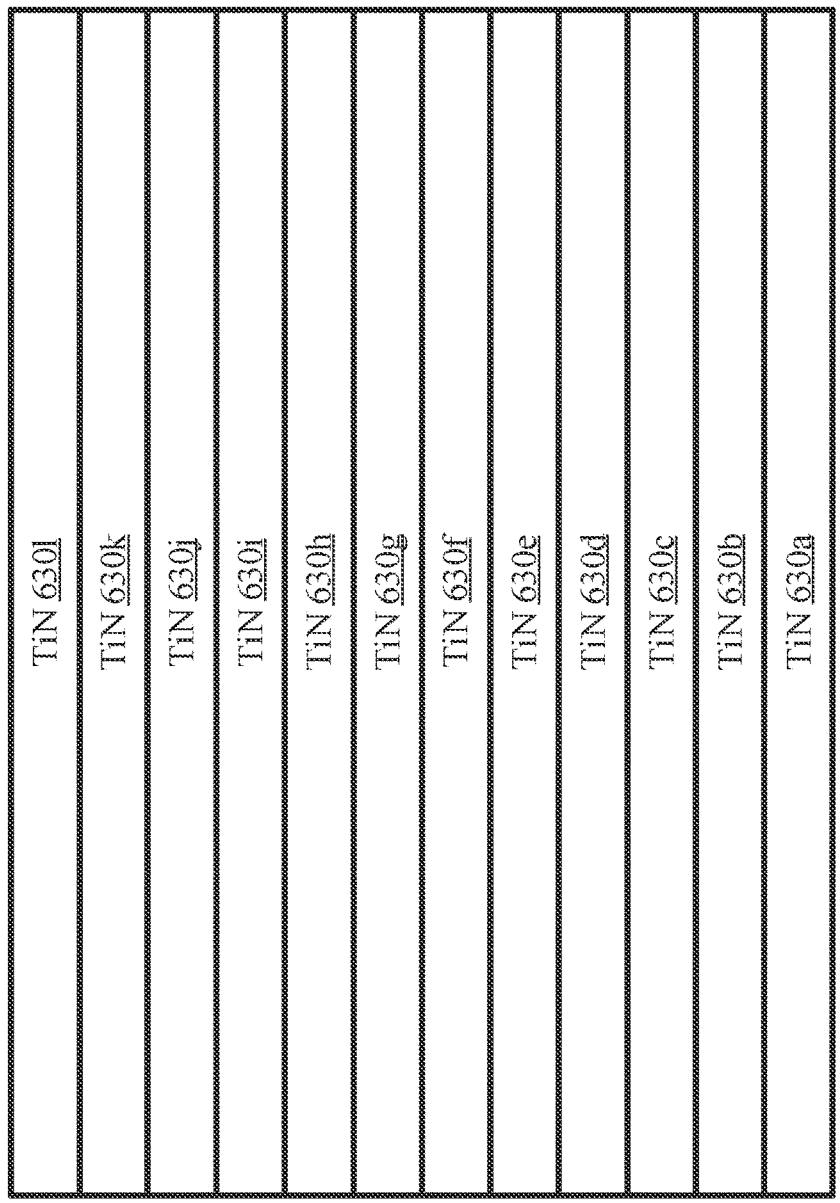
FIG. 6 depicts a third exemplary superlattice thermal barrier layer, according to some embodiments.

Referring to FIG. 6, a third exemplary superlattice thermal barrier 620 is depicted, according to some embodiments. Superlattice thermal barrier 620 may correspond to superlattice thermal barrier 120 (FIG. 1) or superlattice thermal barrier 220 (FIG. 2). In some instances, instead of having different materials in the superlattice thermal barrier (for instance, as depicted in FIG. 4 and FIG. 5), the superlattice thermal barrier may include a plurality of layers of the same material. For instance, superlattice thermal barrier 620 includes a plurality of layers (630a-l) of TiN. Although TiN is depicted, other thermal barrier materials could be used here.

In some instances, each layer (630a-l) of TiN may be deposited separately, for example using chemical vapor deposition (CVD), physical vapor deposition (PVD), or atomic layer deposition (ALD) techniques. When a single material, such as TiN, is deposited in a multi-layer fashion (i.e., each layer deposited separately), each layer may remain separate (as opposed to a thick single layer). This may result in a plurality of thin layers of TiN. As discussed above, thin layers (for instance, between 1 and 5 nm thick) may have lower thermal conductivity and lower resistance drift than a thicker layer of the same material. Therefore, a superlattice thermal barrier 620 with a plurality of layers (630 a-l) of TiN may have a relatively low thermal conductivity and resistance drift, which may improve the energy efficiency of the PCM cell (especially compared to a thermal barrier with a single layer of material).

The multiple thin layers with a high interfacial thermal resistance may retain more heat (i.e., be more effective as a thermal barrier) than a single thick layer, as each of the multiple interfaces add to the total thermal resistance of the barrier film stack. This may result in less heat escaping through all the thin layers compared to the amount of heat that escaped through a single thicker layer. Further, as discussed herein, thin layers of material may have much smaller grain size compared to a thicker layer. The grain boundaries (i.e., interfaces between each grain) can act as additional interfaces that add to the thermal resistance, therefore multiple thin layers with more grains and thus more interfaces between grains may have a higher thermal resistance than a single thick layer.

Figure 7:
FIG. 7 depicts a fourth exemplary superlattice thermal barrier layer, according to some embodiments.

Referring to FIG. 7, a fourth exemplary superlattice thermal barrier 720 is depicted, according to some embodiments. Superlattice thermal barrier 720 may correspond to superlattice thermal barrier 120 (FIG. 1) or superlattice thermal barrier 220 (FIG. 2). In some instances, instead of using phase change materials as the thermal barrier materials (as discussed above in FIG. 4 and FIG. 5), metal materials may be used for the superlattice thermal barrier. Although metal may have a higher thermal conductivity than materials such as GeTe, $Sb_2Te_3$, and TiTe, multiple thin layers of metal may have a lower thermal conductivity than the same metal material(s) in a thick single layer. Therefore, a superlattice thermal barrier with multiple layers of metal may still help reduce the thermal conductivity of the thermal barrier which may help increase the energy efficiency of the PCM cell.

Superlattice thermal barrier 720 is one example of a multi-layer metal barrier. In some instances, multi-layer, as referred to herein, includes at least 3 layers. Specifically, superlattice thermal barrier 720 includes alternating metal layers of TiN (730a-d), TaN (740a-d), and TiSiN (750a-d). Although three different metals (TiN, TaN, and TiSiN) are depicted in FIG. 7, superlattice thermal barrier 720 may include any number of metals. For example, superlattice thermal barrier 720 may include alternating layers (730 and 740) of TiN and TaN without any layers (750) of TiSiN, in some instances. Similar to the other exemplary superlattice thermal barriers 420 (FIG. 4), 520 (FIG. 5), and 620 (FIG. 6), superlattice thermal barrier 720 may include any number of layers (for example, up to 50 layers, between 10-30 layers, etc.) and may include layers with thicknesses between 1 and 5 nm, in some instances.

Figure 8:
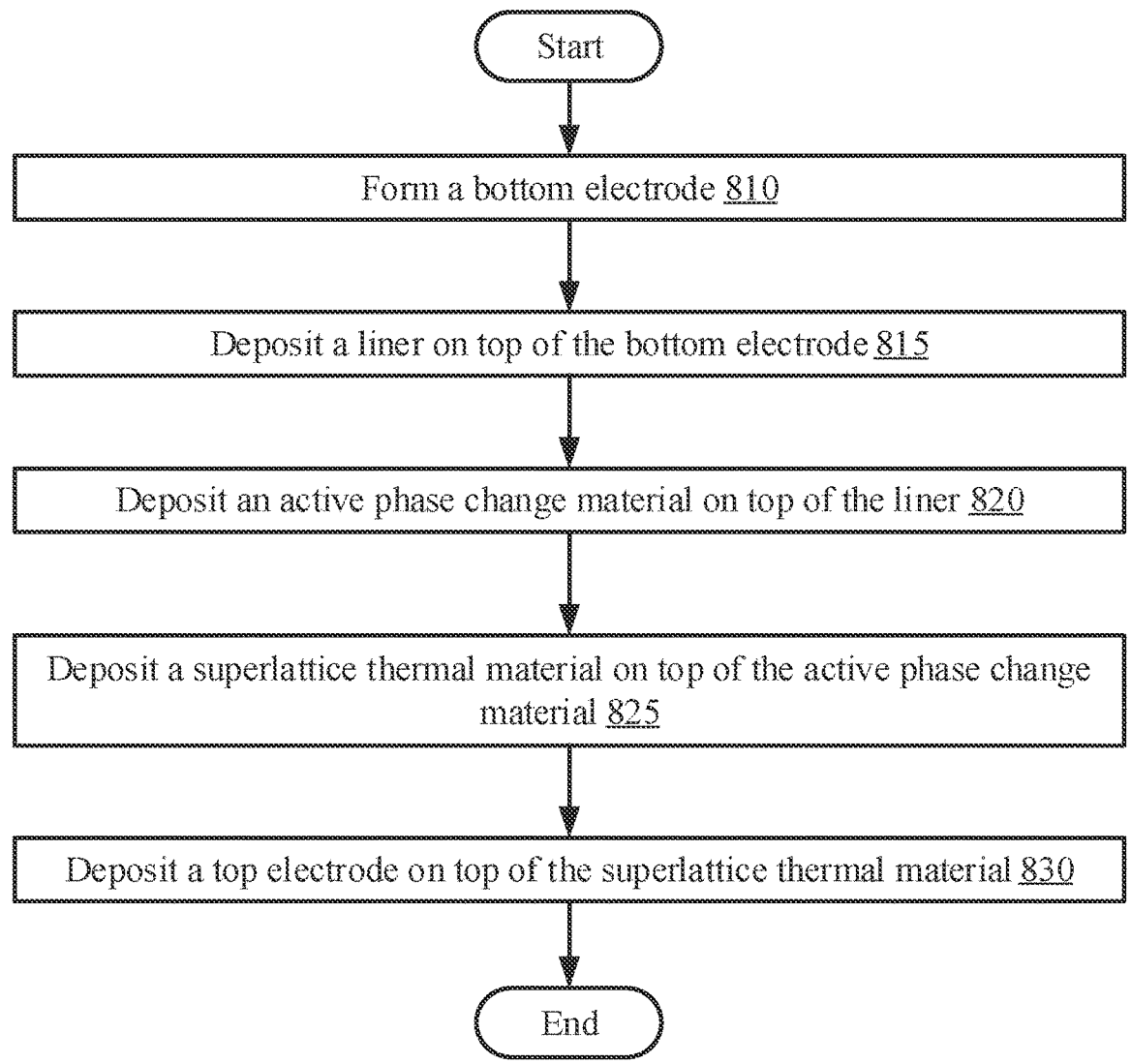
FIG. 8 depicts a flowchart of an exemplary method for forming a phase change memory cell with a superlattice thermal barrier layer, according to some embodiments.

Referring to FIG. 8, a flowchart of an exemplary method 800 for forming a phase change memory cell with a superlattice thermal barrier is depicted, according to some embodiments. Method 800 may be used to form phase change memory cell 100 (FIG. 1) or 200 (FIG. 2) with superlattice thermal barrier 420 (FIG. 4), 520 (FIG. 5), 620 (FIG. 6), or 720 (FIG. 7).

Method 800 includes operation 810 to form a bottom electrode. In some instances, forming the bottom electrode includes depositing each layer of the bottom electrode and etching each layer into their respective shape (i.e., U-shaped or L-shaped). For example, forming a bottom electrode may include depositing a first material (such as TiN, TaN, or SiN). This material may become the outside layer of the bottom electrode. For a U-shaped bottom electrode, the first material may be patterned to form a via opening (in the V- and/or U-shape) that will later be filled with the other materials. For an L-shaped bottom electrode, the first material may be patterned to form a larger via opening, with only an L-shape of the first material remaining (for example, layer 250a (FIG. 2)). The opening may be patterned/etched using reactive ion etching (RIE) in some instances.

Next, a heater material (such as TiN or TaN) may be deposited in the via opening created in the previous step. This may become the middle layer (such as layer 150b (FIG. 1) or 250b (FIG. 2)) of the bottom electrode. This layer may be etched, similar to the first layer, into either a U-shape or an L-shape while also creating an opening for the third layer. Lastly, a dielectric material (such as SiN or TaN) may be deposited in the opening created in the previous step. Any excess material from the depositing may be etched away, leaving either a U-shaped bottom electrode, such as bottom electrode 150 (FIG. 1), or an L-shaped bottom electrode, such as bottom electrode 250 (FIG. 2).

Method 800 includes operation 815 to deposit a liner on top of (i.e., proximately connected to) the bottom electrode. As mentioned herein, the liner may help stabilize resistance and reduce resistance drift (particularly in RESET states) and may be made up of carbon, titanium nitride (TiN), titanium carbide (TiC), tantalum nitride (TaN), tantalum carbide (TaC), tungsten nitride (WN), tungsten carbide (WC), titanium silicon nitride (TiSiN), tantalum silicon nitride (TaSiN), etc. In some instances, not depicted, the bottom electrode may be surrounded by dielectric (at least to the left and right of the bottom electrode), and the liner may be deposited on top of the bottom electrode and the dielectric.

Method 800 includes operation 820 to deposit an active phase change material on top of (i.e., proximately connected to) the liner. The active phase change material may be a material such as germanium-antimony-tellurium (or $Ge_2Sb_2Te_5$, referred to herein as GST), GeTe, $Sb_2Te_3$, TiTe, any other elemental, binary, or ternary alloys of antimony, tellurium, and germanium, or any other alternative materials, that actively changes phases between crystalline and amorphous (or some combination of the two) in order to store data and perform memory compute operations. In some instances, the active phase change material may also contain the following dopants or alloying elements: Carbon, Oxygen, $SiO_2$, SiN, Nitrogen, and/or SiON. In some instances, the active phase change material may span a similar width as the liner.

Although method 800 includes depositing a liner and depositing the active phase change material on top of the liner, there are some instances where the PCM may not include a liner. In these instances, the active phase change material may be deposited on top of (i.e., proximately connected to) the bottom electrode. In some instances (not depicted), the bottom electrode may be surrounded by dielectric, and the active phase change material may be deposited on top of both the bottom electrode and the dielectric.

Method 800 includes operation 825 to deposit a superlattice thermal material on top of (i.e., proximately connected to) the active phase change material. As discussed herein, the superlattice thermal material may include a plurality of layers of material(s). For example, the superlattice thermal material may include alternating layers of GeTe and $Sb_2Te_3$ (as depicted in FIG. 4), alternating layers of TiTe and $Sb_2Te_3$ (as depicted in FIG. 5), separate layers of a same material such as TiN (as depicted in FIG. 6), and/or a plurality of layers of different metals such as TiN, TaN, and/or TiSiN (as depicted in FIG. 7). Each layer may be deposited using techniques such as chemical vapor deposition (CVD), physical vapor deposition (PVD), or atomic layer deposition (ALD). In some instances, when the thermal barrier material includes phase change materials similar to the active phase change material, the same deposition technique may be used to deposit both the active phase change material and the superlattice thermal barrier. In some instances, each layer may be allowed to set before the deposition of the next layer, therefore helping prevent each layer from merging together to form more of a single thicker layer of material(s).

In some instances, any extra material from the deposition of the liner, active phase change material, and/or superlattice thermal barrier may be removed through etching. Because the material(s) of the superlattice thermal barrier may be similar to the materials of the active phase change material (particularly when the superlattice thermal barrier includes GeTe, $Sb_2Te_3$, and/or TiTe), the same techniques may be used to etch both the active phase change material and the superlattice thermal barrier. This may save time and prevent stopping and starting the formation process of the PCM, as there is no need to switch to a different etching process for the active phase change material and the superlattice thermal barrier.

Lastly, method 800 includes operation 830 to deposit a top electrode on top of (i.e., proximately connected to) the superlattice thermal material. In some instances, the top electrode may be a metal material such as TiN, TaN, or TiSiN and may exchange current with the bottom electrode.

The present invention may be a system, a method, etc. at any possible technical detail level of integration. The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory comprising:
   a bottom electrode including a heater;
   an active phase change material;
   a superlattice thermal barrier proximately connected to the active phase change material; and
   a top electrode proximately connected to the superlattice thermal barrier,
   wherein the active phase change material is formed between the heater and the superlattice thermal barrier.

2. The phase change memory of claim 1, wherein the superlattice thermal barrier comprises a plurality of alternating layers of GeTe and $Sb_2Te_3$.

3. The phase change memory of claim 2, wherein the GeTe layers have a thickness of 1 nanometer and the $Sb_2Te_3$ layers have a thickness of 4 nanometers.

4. The phase change memory of claim 1, wherein the superlattice thermal barrier comprises a plurality of alternating layers of TiTe and $Sb_2Te_3$.

5. The phase change memory of claim 1, wherein the superlattice thermal barrier comprises a plurality of layers of a same material.

6. The phase change memory of claim 1, wherein the superlattice thermal barrier comprises a plurality of layers of two or more alternating metals, wherein the metals are selected from a group consisting of: TiN, TaN, and TiSiN.

7. The phase change memory of claim 1, wherein each layer of the superlattice thermal barrier has a thickness between 1 and 5 nanometers.

8. The phase change memory of claim 1, wherein the superlattice thermal barrier comprises between 5 and 50 layers.

9. The phase change memory of claim 1, wherein a cross-section of the bottom electrode is U-shaped.

10. The phase change memory of claim 1, wherein a cross-section of the bottom electrode is L-shaped.

11. The phase change memory of claim 1, further comprising:
    a liner proximately connected to the bottom electrode and the active phase change material.

12. The phase change memory of claim 10, wherein the liner is made of carbon, TiN, TiC, TaN, TaC, WN, WC, TiSiN, or TaSiN.

13. A system comprising:
    a phase change memory cell, the phase change memory cell comprising:
       a bottom electrode including a heater;
       an active phase change material;
       a superlattice thermal barrier proximately connected to the active phase change material; and
       a top electrode proximately connected to the superlattice thermal barrier,
       wherein the active phase change material is formed between the heater and the superlattice thermal barrier.

14. The system of claim 13, wherein the superlattice thermal barrier comprises a plurality of alternating layers of GeTe and $Sb_2Te_3$.

15. The system of claim 13, wherein the superlattice thermal barrier comprises a plurality of alternating layers of TiTe and $Sb_2Te_3$.

16. The system of claim 13, wherein a cross-section of the bottom electrode is U-shaped or L-shaped.

17. A method of forming a phase change memory, the method comprising:
    depositing an active phase change material on a bottom electrode, the bottom electrode including a heater;
    depositing a superlattice thermal barrier proximately connected to the active phase change material; and
    depositing a top electrode proximately connected to the superlattice thermal barrier,
    wherein the active phase change material is formed between the heater and the superlattice thermal barrier.

18. The method of claim 17, wherein depositing a superlattice thermal barrier comprises:
    depositing alternating layers of GeTe and $Sb_2Te_3$.

19. The method of claim 17, wherein depositing a superlattice thermal barrier comprises:
    depositing alternating layers of TiTe and $Sb_2Te_3$.

20. The method of claim 17, further comprising:
    depositing a liner on top of a bottom electrode, wherein the active phase change material is deposited proximately connected to the liner.

* * * * *